United States Patent
You (10) Patent No.: US 9,805,975 B2
(45) Date of Patent: Oct. 31, 2017

(54) THIN-FILM TRANSISTOR ARRAY SUBSTRATE INCLUDING GATE-UNDERLYING STEPPED LAYER AND ETCH-STOPPER, AND ORGANIC LIGHT EMITTING DISPLAY INCLUDING THE SAME

(71) Applicant: SAMSUNG DISPLAY CO., LTD., Yongin-si, Gyeonggi-Do (KR)

(72) Inventor: Chungi You, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 20 days.

(21) Appl. No.: 14/947,114

(22) Filed: Nov. 20, 2015

(65) Prior Publication Data
US 2016/0307980 A1    Oct. 20, 2016

(30) Foreign Application Priority Data
Apr. 20, 2015   (KR) .................. 10-2015-0055346

(51) Int. Cl.
| | | |
|---|---|---|
| *H01L 27/32* | (2006.01) | |
| *H01L 21/768* | (2006.01) | |
| *H01L 29/24* | (2006.01) | |
| *H01L 29/786* | (2006.01) | |
| *H01L 29/66* | (2006.01) | |
| *H01L 29/10* | (2006.01) | |
| *H01L 27/12* | (2006.01) | |

(52) U.S. Cl.
CPC .... *H01L 21/76879* (2013.01); *H01L 29/1066* (2013.01); *H01L 29/24* (2013.01); *H01L 29/66969* (2013.01); *H01L 29/7869* (2013.01); *H01L 27/1225* (2013.01)

(58) Field of Classification Search
CPC ..... H01L 2029/42388; H01L 29/42384; H01L 27/3262; H01L 27/3248; H01L 21/76829
See application file for complete search history.

(56) References Cited

U.S. PATENT DOCUMENTS

| | | | | |
|---|---|---|---|---|
| 5,156,986 A * | 10/1992 | Wei | .................. | H01L 21/28008 257/347 |
| 5,811,835 A * | 9/1998 | Seiki | ................. | H01L 29/42384 257/57 |
| 6,331,680 B1 * | 12/2001 | Klassen | .................... | C23C 4/02 174/261 |
| 2005/0272189 A1 * | 12/2005 | Cho | .................... | H01L 27/1214 438/163 |

(Continued)

FOREIGN PATENT DOCUMENTS

| | | |
|---|---|---|
| KR | 1020130067592 | 6/2013 |
| KR | 1020130099693 | 9/2013 |
| KR | 1020140101526 | 8/2014 |

*Primary Examiner* — Victoria K Hall
(74) *Attorney, Agent, or Firm* — F. Chau & Associates, LLC (57) ABSTRACT

A thin-film transistor (TFT) array substrate includes a substrate, a gate-underlying stepped layer disposed on the substrate, a gate electrode disposed on the gate-underlying stepped layer, a semiconductor layer formed over the gate electrode, and an etch-stopper disposed on the semiconductor layer. The gate-underlying stepped layer is formed under the gate electrode and has a width greater than a width of the gate electrode.

27 Claims, 7 Drawing Sheets

(56) References Cited

U.S. PATENT DOCUMENTS

| | | | |
|---|---|---|---|
| 2011/0073863 A1* | 3/2011 | Asanuma | H01L 29/04 257/59 |
| 2014/0042397 A1 | 2/2014 | Cho et al. | |
| 2014/0225195 A1 | 8/2014 | Kim et al. | |
| 2015/0340455 A1* | 11/2015 | Cao | G02F 1/1368 257/43 |

* cited by examiner

THIN-FILM TRANSISTOR ARRAY SUBSTRATE INCLUDING GATE-UNDERLYING STEPPED LAYER AND ETCH-STOPPER, AND ORGANIC LIGHT EMITTING DISPLAY INCLUDING THE SAME

CROSS-REFERENCE TO RELATED APPLICATIONS

This application claims priority under 35 U.S.C. §119 to Korean Patent Application No. 10-2015-0055346, filed on Apr. 20, 2015, the disclosure of which is incorporated by reference herein in its entirety.

TECHNICAL FIELD

Exemplary embodiments of the inventive concept relate to a thin-film transistor (TFT) array substrate and an organic light-emitting display including the same.

DISCUSSION OF THE RELATED ART

An organic light-emitting display includes a hole injection electrode, an electron injection electrode, and an organic light-emitting device (OLED) including an organic emission layer that is formed between the hole injection electrode and the electron injection electrode. The organic light-emitting display is a self-emissive display that generates light when excitons generated when holes injected from the hole injection electrode and electrons injected from the electron injection electrode combine with each other in the organic emission layer and change from an excited state to a ground state.

The self-emissive organic light-emitting display does not require an additional light source, and thus, may operate with a low voltage and may have a light and thin design. Further, the organic light-emitting display has excellent characteristics such as a wide viewing angle, a high contrast ratio, and a fast response time.

SUMMARY

According to an exemplary embodiment of the inventive concept, a thin-film transistor (TFT) array substrate includes a substrate, a gate-underlying stepped layer disposed on the substrate, a gate electrode disposed on the gate-underlying stepped layer, a semiconductor layer formed over the gate electrode, and an etch-stopper disposed on the semiconductor layer. The gate-underlying stepped layer is formed under the gate electrode and has a width greater than a width of the gate electrode.

In an exemplary embodiment, the etch-stopper has a width about equal to or greater than the width of the gate-underlying stepped layer.

In an exemplary embodiment, ends of the etch-stopper are formed at positions corresponding to ends of the gate-underlying stepped layer, and the ends of the etch-stopper cover stepped portions of the gate electrode and the gate-underlying stepped layer.

In an exemplary embodiment, the TFT array substrate further includes a source electrode and a drain electrode disposed over the etch-stopper. The source electrode and the drain electrode are formed at positions corresponding to ends of the gate-underlying stepped layer.

In an exemplary embodiment, the TFT array substrate further includes a via layer formed over the source electrode and the drain electrode and covering an entire surface of the substrate.

In an exemplary embodiment, the via layer includes a contact hole at least partially exposing the source electrode and the drain electrode. The via layer and the contact hole are formed using one mask.

In an exemplary embodiment, the TFT array substrate further includes a source electrode and a drain electrode disposed over the etch-stopper. A distance between the source electrode and the drain electrode corresponds to the width of the gate-underlying stepped layer.

In an exemplary embodiment, the TFT array substrate further includes a via layer formed over the source electrode and the drain electrode and covering an entire surface of the substrate.

In an exemplary embodiment, the via layer further includes a contact hole at least partially exposing the source electrode and the drain electrode. The via layer and the contact hole are formed using one mask.

In an exemplary embodiment, the TFT array substrate further includes a gate insulating film disposed between the gate electrode and the semiconductor layer.

According to an exemplary embodiment of the inventive concept, a thin-film transistor (TFT) array substrate includes a substrate, a gate-underlying stepped layer disposed on the substrate, a gate electrode disposed on the gate-underlying stepped layer, an oxide semiconductor layer formed over the gate electrode, and an etch-stopper disposed on the oxide semiconductor layer. The etch-stopper has a width about equal to or greater than a width of the gate-underlying stepped layer.

In an exemplary embodiment, the gate-underlying stepped layer is disposed under the gate electrode, and the width of the gate-underlying stepped layer is about equal to or greater than a width of the gate electrode.

In an exemplary embodiment, the TFT array substrate further includes a via layer formed over the source electrode and the drain electrode and covering an entire surface of the substrate.

In an exemplary embodiment, the via layer includes a contact hole at least partially exposing the source electrode and the drain electrode, and the via layer and the contact hole are formed using one mask.

In an exemplary embodiment, the TFT array substrate further includes a source electrode and a drain electrode disposed over the etch-stopper. The source electrode and the drain electrode are formed at positions corresponding to ends of the gate-underlying stepped layer.

In an exemplary embodiment, the TFT array substrate further includes a via layer formed over the source electrode and the drain electrode and covering an entire surface of the substrate.

In an exemplary embodiment, the via layer includes a contact hole at least partially exposing the source electrode and the drain electrode, and the via layer and the contact hole are formed using one mask.

In an exemplary embodiment, the TFT array substrate further includes a source electrode and a drain electrode disposed over the etch-stopper. A distance between the source electrode and the drain electrode corresponds to the width of the gate-underlying stepped layer.

According to an exemplary embodiment of the inventive concept, a thin-film transistor (TFT) array substrate includes a substrate, a gate-underlying stepped layer disposed on the substrate, a gate electrode disposed on the gate-underlying stepped layer, an oxide semiconductor layer formed over the gate electrode, and an etch-stopper disposed on the oxide semiconductor layer. Ends of the etch-stopper are formed at positions corresponding to ends of the gate-underlying stepped layer, and the ends of the etch-stopper cover stepped portions of the gate-underlying stepped layer and the gate electrode.

According to an exemplary embodiment of the inventive concept, an organic light-emitting display includes a display area including a plurality of pixels, and a non-display area disposed around the display area. Each of the plurality of pixels includes a substrate, a gate-underlying stepped layer disposed on the substrate, a gate electrode disposed on the gate-underlying stepped layer, an oxide semiconductor layer formed over the gate electrode, and an etch-stopper disposed on the oxide semiconductor layer. The gate-underlying stepped layer is formed under the gate electrode and has a width greater than a width of the gate electrode.

In an exemplary embodiment, the etch-stopper has a width about equal to or greater than the width of the gate-underlying stepped layer.

In an exemplary embodiment, ends of the etch-stopper are formed at positions corresponding to ends of the gate-underlying stepped layer, and the ends of the etch-stopper cover stepped portions of the gate electrode and the gate-underlying stepped layer.

In an exemplary embodiment, the organic light-emitting display further includes a source electrode and a drain electrode disposed over the etch-stopper. The source electrode and the drain electrode are formed at positions corresponding to ends of the gate-underlying stepped layer.

In an exemplary embodiment, the organic light-emitting display further includes a via layer formed over the source electrode and the drain electrode and covering an entire surface of the substrate.

In an exemplary embodiment, the via layer includes a contact hole at least partially exposing the source electrode and the drain electrode, and the via layer and the contact hole are formed using one mask.

In an exemplary embodiment, the organic light-emitting display further includes a source electrode and a drain electrode disposed over the etch-stopper. A distance between the source electrode and the drain electrode corresponds to the width of the gate-underlying stepped layer.

In an exemplary embodiment, the organic light-emitting display further includes a via layer formed over the source electrode and the drain electrode and covering an entire surface of the substrate.

In an exemplary embodiment, the via layer includes a contact hole at least partially exposing the source electrode and the drain electrode, and the via layer and the contact hole are formed using one mask.

In an exemplary embodiment, the organic light-emitting display further includes a gate insulating film disposed between the gate electrode and the oxide semiconductor layer.

According to an exemplary embodiment of the inventive concept, an organic light-emitting display includes a display area including a plurality of pixels, and a non-display area disposed around the display area. Each of the plurality of pixels includes a substrate, a gate-underlying stepped layer disposed on the substrate, a gate electrode disposed on the gate-underlying stepped layer, an oxide semiconductor layer formed over the gate electrode, and an etch-stopper disposed on the oxide semiconductor layer. The etch-stopper has a width about equal to or greater than a width of the gate-underlying stepped layer.

According to an exemplary embodiment of the inventive concept, a method of forming a thin-film transistor (TFT) array substrate includes forming a substrate, forming a gate-underlying stepped layer on the substrate, forming a gate electrode on the gate-underlying stepped layer, forming a semiconductor layer over the gate electrode, and forming an etch-stopper on the semiconductor layer. The gate-underlying stepped layer is formed under the gate electrode and has a width greater than a width of the gate electrode.

In an exemplary embodiment, the method further includes forming a source electrode and a drain electrode over the etch-stopper at positions corresponding to ends of the gate-underlying stepped layer, forming a via layer over the source electrode and the drain electrode, and forming a contact hole at least partially exposing the source electrode and the drain electrode. The via layer covers an entire surface of the substrate, and the via layer and the contact hole are formed using one mask.

BRIEF DESCRIPTION OF THE DRAWINGS

The above and other features will become more apparent by describing in detail exemplary embodiments thereof with reference to the accompanying drawings, in which.

DETAILED DESCRIPTION OF THE EXEMPLARY EMBODIMENTS

Exemplary embodiments of the present inventive concept will be described more fully hereinafter with reference to the accompanying drawings. In the drawings, the size and relative sizes of layers and regions may be exaggerated for clarity. Like reference numerals may refer to like elements throughout the accompanying drawings.

It will be understood that although the terms "first", "second", etc. may be used herein to describe various elements, these elements should not be limited by these terms. These elements are only used to distinguish one element from another. Thus, a "first" element in an exemplary embodiment may be described as a "second" element in another exemplary embodiment.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items.

Herein, when two or more elements or values are described as being substantially the same as or equal to each other, it is to be understood that the elements or values are identical to each other, indistinguishable from each other, or distinguishable from each other but functionally the same as each other as would be understood by a person having ordinary skill in the art. Further, when processes are described as being performed at substantially the same time, it is to be understood that the processes may be performed at exactly the same time or at about the same time as would be understood by a person having ordinary skill in the art.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

Figure 1:
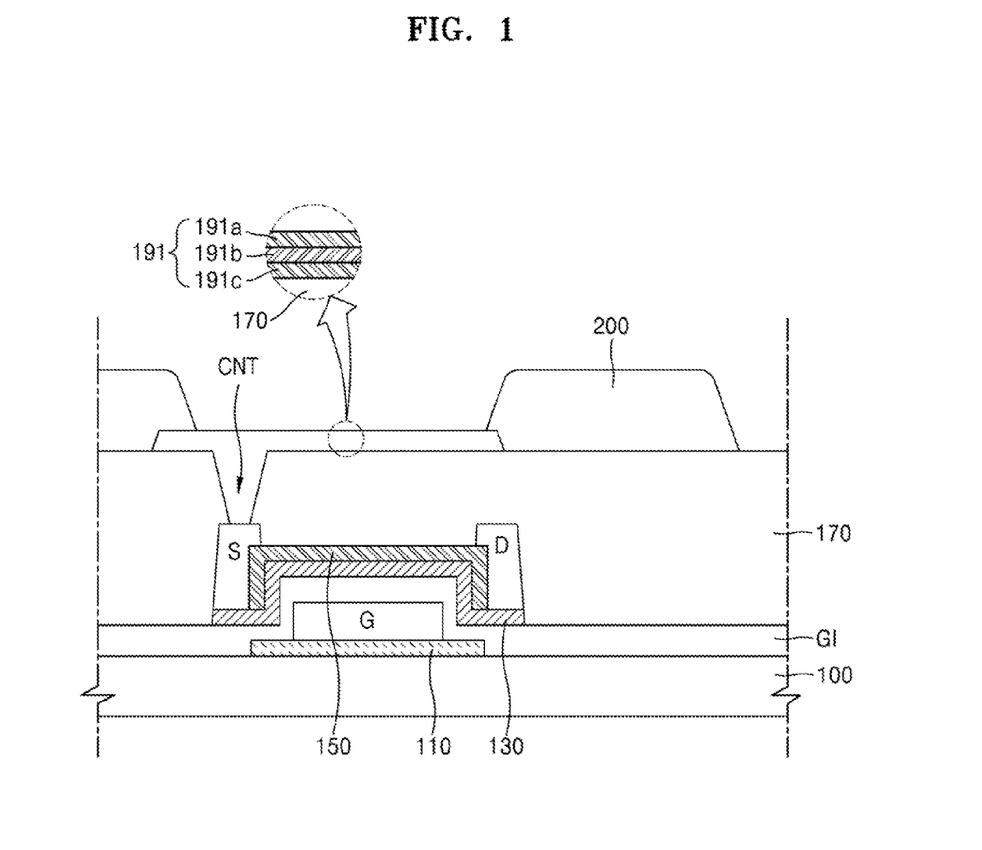
FIG. 1 is a cross-sectional view of a thin-film transistor (TFT) array substrate according to an exemplary embodiment of the inventive concept.

FIG. 1 is a cross-sectional view of a thin-film transistor (TFT) array substrate according to an exemplary embodiment of the inventive concept.

Referring to FIG. 1, the TFT array substrate according to an exemplary embodiment may include a substrate 100, a gate-underlying stepped layer 110, a gate electrode G, a semiconductor layer 130, and an etch-stopper 150 provided on the substrate 100.

The substrate 100 may be formed of a transparent material such as, for example, glass. However, the substrate 100 is not limited thereto.

The gate-underlying stepped layer 110 may be provided over the substrate 100 to be located under the gate electrode G. For example, the gate-underlying stepped layer 110 may be disposed between the substrate 100 and the gate electrode G. As shown in FIG. 1, according to an exemplary embodiment, the gate-underlying stepped layer 110 may be formed to have a width greater than a width of the gate electrode G.

The gate-underlying stepped layer 110 may prevent poor step coverage. For example, without the gate-underlying stepped layer 110, poor step coverage may occur. That is, when only the gate electrode G is formed over the substrate 100 without the gate-underlying stepped layer 110, poor step coverage may occur.

For example, when only the gate electrode G is formed, a large stepped portion may be formed between the substrate 100 and both ends of the gate electrode G. For example, the sides of the gate electrode G extending from the upper surface of the gate electrode G downward toward the substrate 100 may be large when only the gate electrode G is formed. This large stepped portion may increase as a stack increases, thereby resulting in poor step coverage.

In the TFT array substrate according to exemplary embodiments of the inventive concept, since the gate-underlying stepped layer 110 (e.g., one stepped portion) is formed under the gate electrode G, and since the gate-underlying stepped layer 110 (e.g., the one stepped portion) is further formed between the substrate 100 and both ends of the gate electrode G, the stepped portions as a whole and poor step coverage may be reduced.

The material of the gate electrode G may include at least one metal selected from among, for example, molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu). However, the material of the gate electrode G is not limited thereto.

A gate insulating film GI may be formed over the gate electrode G, and may be formed to correspond to an entire surface of the substrate 100. That is, the gate insulating film GI may cover an entirety of the substrate 100. The gate insulating film GI may be formed to have a multi-layer or single-layer structure formed of an inorganic material such as, for example, silicon oxide or silicon nitride. However, the gate insulating film GI is not limited thereto. The gate insulating film GI may insulate the gate electrode G from the semiconductor layer 130, which may be provided over the gate insulating film GI.

In an exemplary embodiment, the semiconductor layer 130 includes a transparent conductive oxide. The transparent conductive oxide may include, for example, at least one element selected from among gallium (Ga), indium (In), zinc (Zn), hafnium (Hf), and tin (Sn). For example, the transparent conductive oxide may be selected from InGaZnO, ZnSnO, InZnO, InGaO, ZnO, TiO, and hafnium-indium-zinc oxide (HIZO). However, exemplary embodiments of the inventive concept are not limited thereto. Since a TFT including a silicon oxide layer is typically formed using a high-temperature process and undergoes a crystallization process, as the size of the TFT increases, uniformity may be reduced during the crystallization process, thereby making it difficult to increase the size of the TFT.

However, since an oxide semiconductor TFT including a transparent conductive oxide has excellent device characteristics and may be formed using a low-temperature process, the oxide semiconductor TFT may be used for a backplane for a flat panel display. Further, since the oxide semiconductor TFT is transparent in a visible region and is flexible, the oxide semiconductor TFT may be applied to a transparent display or a flexible display.

The etch-stopper 150 may be formed over the semiconductor layer 130 as shown in FIG. 1. The etch-stopper 150 may be formed between the gate electrode G and a source electrode S and/or a drain electrode D disposed over the etch-stopper 150, and may protect the semiconductor layer 130.

For example, when the semiconductor layer 130 is formed of an oxide as described above, to ensure high stability, the TFT array substrate may include the etch-stopper 150 to protect a top surface from an etching solution. The etch-stopper 150 may be formed to protect the semiconductor layer 130 from the etching solution that is introduced through a gap between the source electrode S and the drain electrode D.

In the TFT array substrate according to an exemplary embodiment, the etch-stopper 150 may be formed to have a width corresponding to the width of the gate-underlying stepped layer 110. That is, the etch-stopper 150 may be formed so that both ends of the etch-stopper 150 extend to positions corresponding to both ends of the gate-underlying stepped layer 110. For example, the ends of the etch-stopper 150 may align with the ends of the gate-underlying stepped layer 110.

Since the etch-stopper 150 is formed to extend to a stepped portion of the gate electrode G, a structure in which two insulating layers are formed may be formed between the gate electrode G and the source and drain electrodes S and D.

That is, since the gate insulating film GI and the etch-stopper 150 are disposed as two insulating layers between the gate electrode G and the source and drain electrodes S and D, parasitic capacitance between the gate electrode G and the source and drain electrodes S and D may be reduced. As a result, a wiring load in a gate wiring and a data wiring may be reduced, thereby leading to high image quality.

The etch-stopper 150 may be formed to cover all stepped portions formed by the gate electrode G and the gate-underlying stepped layer 110, as described above.

In a comparative example, an etch-stopper is formed to have a width corresponding to the width of the gate electrode G. In this case, in order not to expose the semiconductor layer 130, a distance between the source electrode S and the drain electrode D is reduced.

In this case, the source electrode S and the drain electrode D are formed close to each other. As a result, an overlapped portion may be formed between the source and drain electrodes S and D and the gate electrode G, and parasitic capacitance of a transistor may occur in the overlapped portion, thereby resulting in coupling.

However, in the TFT array substrate according exemplary embodiments of the inventive concept, since the etch-stopper 150 is formed to have a width corresponding to the width of the gate-underlying stepped layer 110, the source electrode S and the drain electrode D may be formed to have a predetermined distance therebetween without damaging the semiconductor layer 130.

That is, since the etch-stopper 150 may cover all stepped portions of the gate electrode G and the gate-underlying stepped layer 110 in exemplary embodiments, parasitic capacitance may be reduced.

Since the etch-stopper 150 is formed to cover all stepped portions of the gate-underlying stepped layer 110 as described above, the source electrode S and the drain electrode D may be formed to have a predetermined distance therebetween.

For example, a distance between the source electrode S and the drain electrode D may be maintained to correspond to the width of the gate-underlying stepped layer 110. That is, the source electrode S and the drain electrode D may be formed at positions corresponding to both ends of the gate-underlying stepped layer 110 (e.g., the source electrode S and the drain electrode D may substantially align with the ends of the gate-underlying stepped layer 110). For example, the distance between the source electrode S and the drain electrode D may be about equal to the width of the gate-underlying stepped layer 110.

In a comparative example of a TFT array substrate, since the gate-underlying stepped layer 110 is not formed, when the source electrode S and the drain electrode D are formed to have a predetermined distance therebetween, an offset area is formed.

However, in the TFT array substrate according to exemplary embodiments of the inventive concept, since the gate-underlying stepped layer 110 is formed under the gate electrode G, and the source electrode S and the drain electrode D are formed to have a distance corresponding to the width of the gate-underlying stepped layer 110, the source electrode S and the drain electrode D may be formed to have a large distance therebetween without forming an offset area, thereby reducing parasitic capacitance.

A via layer 170 may be formed over the etch-stopper 150 and the source and drain electrodes S and D to correspond to the entire surface of the substrate 100. That is, the via layer 170 may cover an entirety of the substrate 100.

The via layer 170 may be formed of an inorganic material or an organic material. The via layer 170 may be formed, for example, of at least one material selected from an acryl-based resin, an epoxy resin, a phenolic resin, a polyamide-based resin, a polyimide-based resin, an unsaturated polyester-based resin, a polyphenylene-based resin, a polyphenylenesulfide-based resin, and benzocyclobutene (BCB). However, exemplary embodiments of the inventive concept are not limited thereto.

A contact hole CNT may be formed in the via hole 170 as shown in FIG. 1.

The source electrode S and/or the drain electrode D may be exposed through the contact hole CNT. One of the source electrode S and the drain electrode D may be connected to a pixel electrode 191 through the contact hole CNT.

In the TFT array substrate according to an exemplary embodiment, the via layer 170 and the contact hole CNT may be formed using one mask instead of multiple masks.

Accordingly, the TFT array substrate may be formed by using fewer masks than those used to form a TFT array substrate in comparative examples, as described further below.

The pixel electrode 191, which is connected to any one of the source electrode S and the drain electrode D through the contact hole CNT, may be formed over the via layer 170.

The pixel electrode 191 may include a semi-transparent metal layer 191b, a first transparent conductive oxide layer 191a that is formed over the semi-transparent metal layer 191b, and a second transparent conductive oxide layer 191c that is formed under the semi-transparent metal layer 191b.

The semi-transparent metal layer 191b may be formed of, for example, silver (Ag) or an Ag alloy. Since the semi-transparent metal layer 191b forms a micro-cavity structure along with a counter electrode 195 (see FIG. 4) that may be a reflective electrode, the luminous efficiency of an organic light-emitting display including the TFT array substrate according to exemplary embodiments of the inventive concept may be improved.

Each of the first and second transparent conductive oxide layers 191a and 191c may include, for example, at least one selected from among indium tin oxide (ITO), indium zinc oxide (IZO), zinc oxide (ZnO), indium oxide ($In_2O_3$), indium gallium oxide (IGO), and aluminum zinc oxide (AZO). However, exemplary embodiments of the inventive concept are not limited thereto. The first transparent conductive oxide layer 191a may increase an adhesive force between the via layer 170 and the semi-transparent metal layer 191b, and the second transparent conductive oxide layer 191c may function as a barrier layer that protects the semi-transparent metal layer 191b.

FIGS. 2A through 2D are cross-sectional views illustrating a process of forming the via layer 170 and the contact hole CNT in the TFT array substrate according to an exemplary embodiment of the inventive concept.

According to an exemplary embodiment, the via layer 170 and the contact hole CNT may be formed using one mask through metal masking. However, the method of forming the via layer 170 and the contact hole CNT is not limited thereto. For example, the via layer 170 and the contact hole CNT may be formed using one mask through a multi-PR process.

As shown in FIGS. 2A through 2D, in the TFT array substrate according to an exemplary embodiment, the via layer 170 and the contact hole CNT may be formed using one mask through metal masking.

Figure 2A:
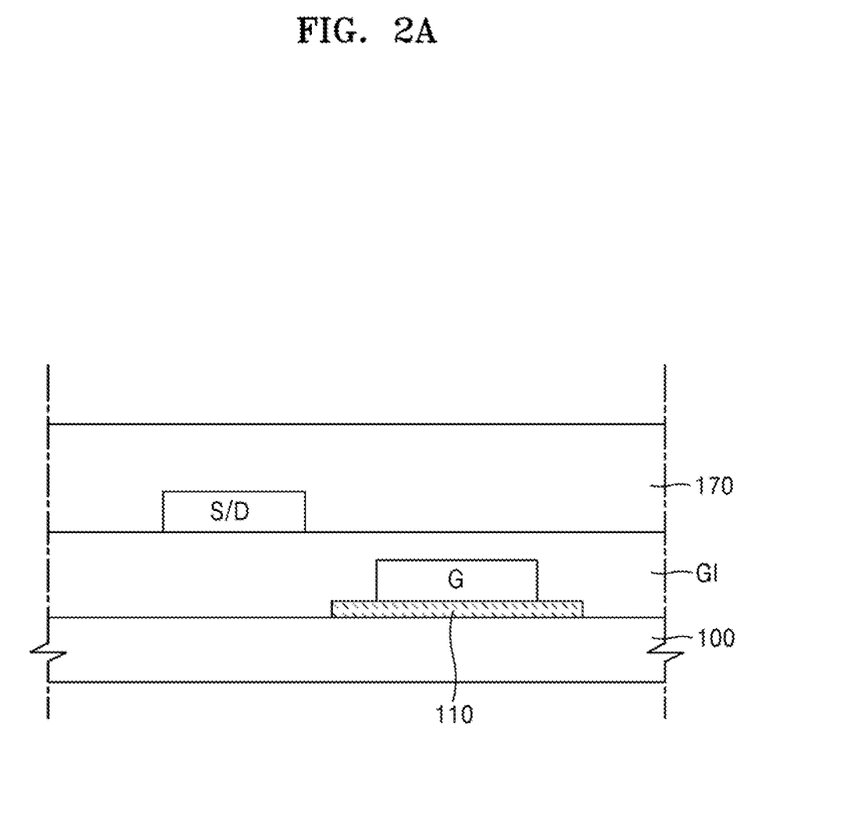
FIGS. 2A through 2D are cross-sectional views illustrating a process of forming a via layer and a contact hole in a TFT array substrate according to an exemplary embodiment of the inventive concept.

Referring to FIG. 2A, first, the via layer 170 may be formed over the entire surface of the substrate 100 to cover the source electrode and/or the drain electrode S/D.

Figure 2B:
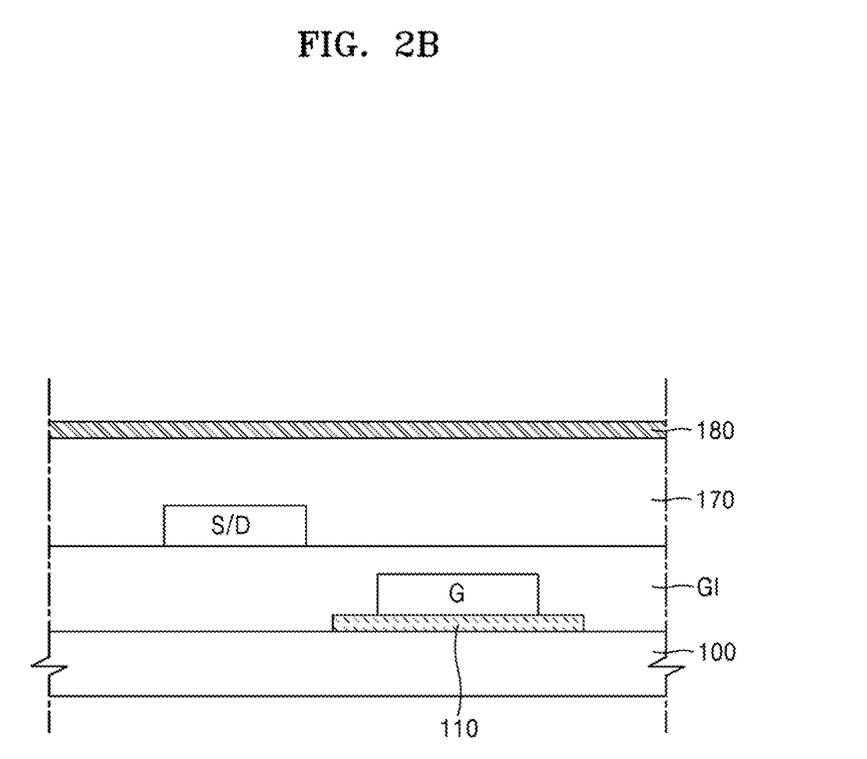

Next, referring to FIG. 2B, a metal layer 180 may be additionally deposited over the via layer 170 allowing for the etching of the via layer 170 and the gate insulating film GI at one time in a subsequent etching process.

Figure 2C:
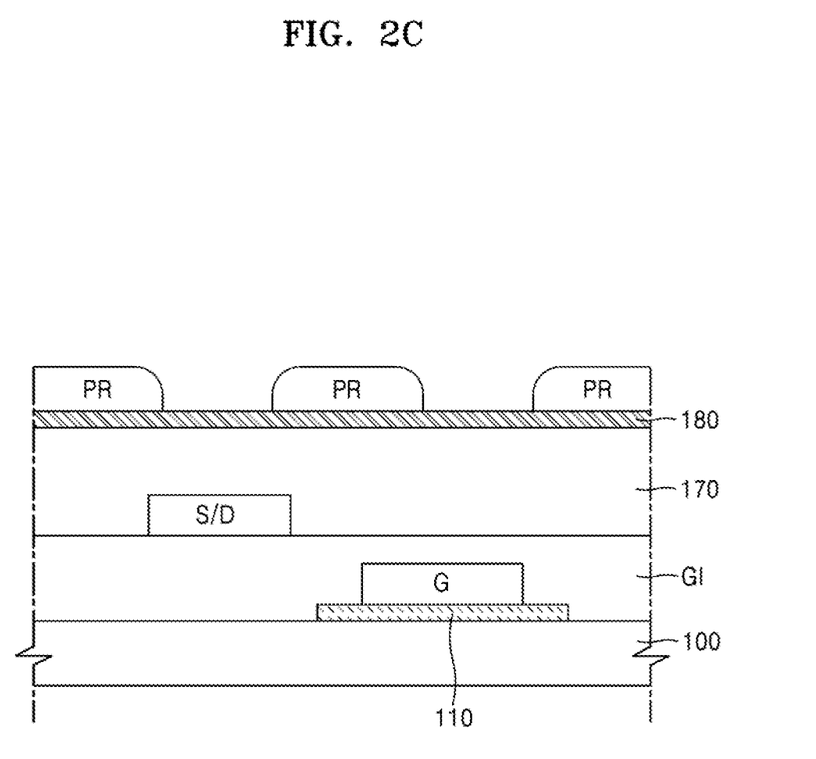
Figure 2D:
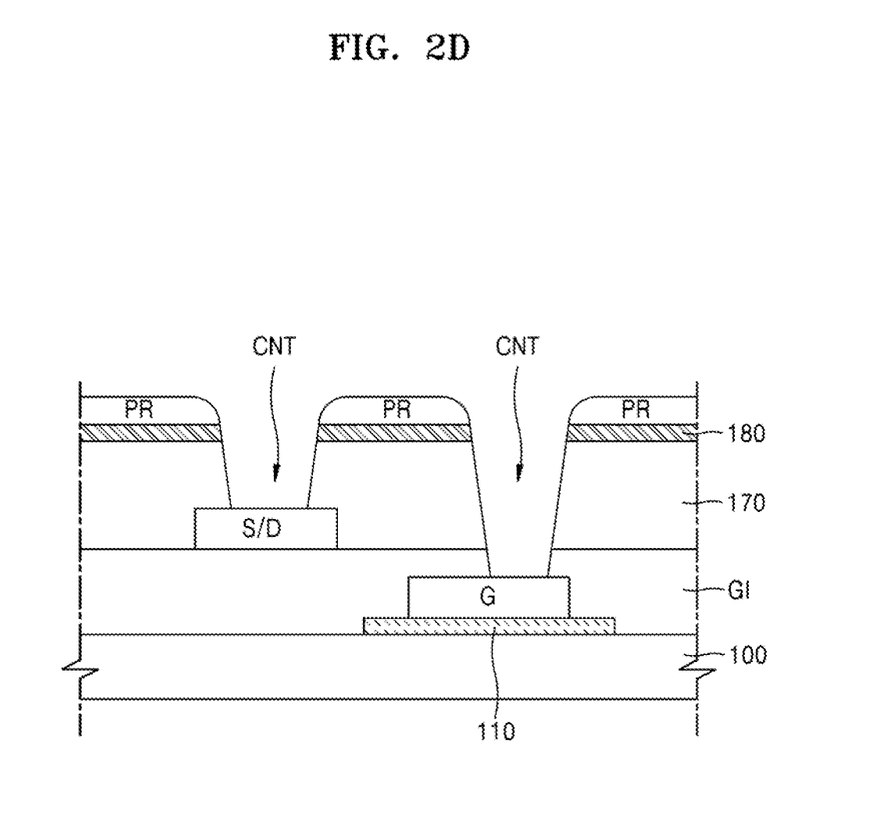

Next, referring to FIG. 2C, exposure is performed using one mask (e.g., photoresist mask PR). As shown in FIG. 2D, the via layer 170 and the gate insulating film GI may be etched to form the contact hole CNT at one time. That is, the via layer 170 and the gate insulating film GI may be etched to form the contact hole CNT as substantially the same time.

Further, the metal layer 180 may be removed in a subsequent process.

Thus, according to exemplary embodiments of the inventive concept, the via layer 170 and the contact hole CNT in a TFT array substrate may be formed using one mask, resulting in a reduction in fabrication time and cost.

According to exemplary embodiments of the inventive concept, a method of forming a TFT array substrate includes forming the substrate 100, forming the gate-underlying stepped layer 110 on the substrate 100, forming the gate electrode G on the gate-underlying stepped layer 110, forming the semiconductor layer 130 over the gate electrode G, and forming the etch-stopper 150 on the semiconductor layer 130. As described above, the gate-underlying stepped layer 110 is formed under the gate electrode G and has a width greater than a width of the gate electrode G. The method may further include forming the source electrode S and the drain electrode D over the etch-stopper 150 at positions corresponding to ends of the gate-underlying stepped layer 110, forming the via layer 170 over the source electrode S and the drain electrode D, and forming the contact hole CNT at least partially exposing the source electrode S and the drain electrode D. As described above, the via layer 170 and the contact hole CNT may be formed using one mask, and the via layer 170 covers an entire surface of the substrate 100.

Figure 3:
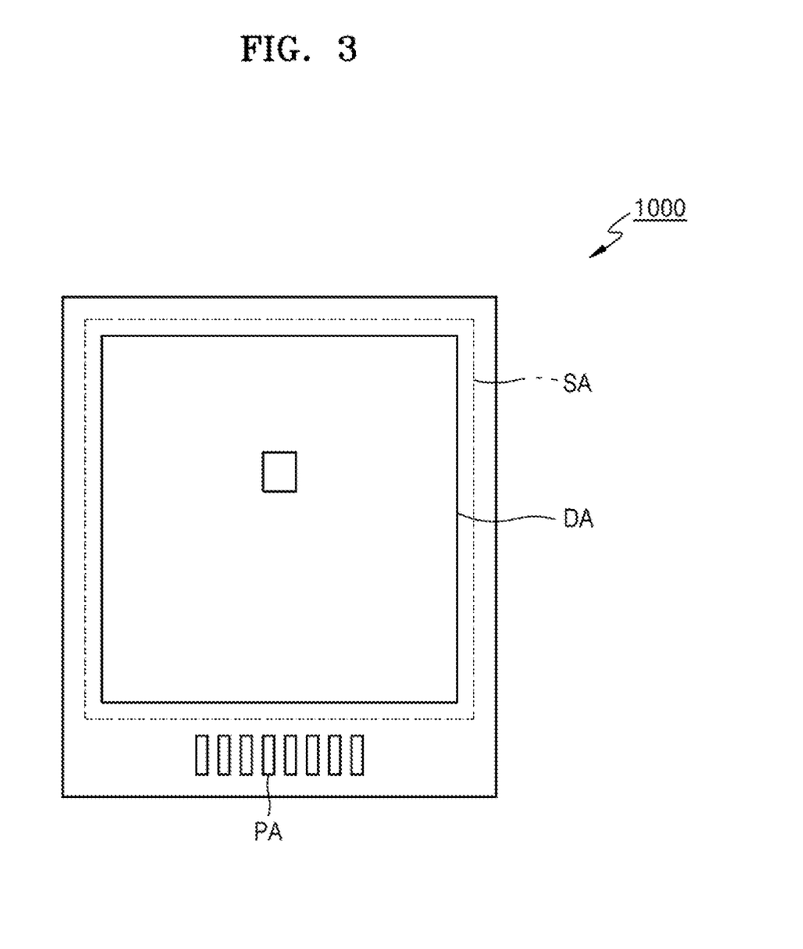
FIG. 3 is a plan view of an organic light-emitting display according to an exemplary embodiment of the inventive concept.
Figure 4:
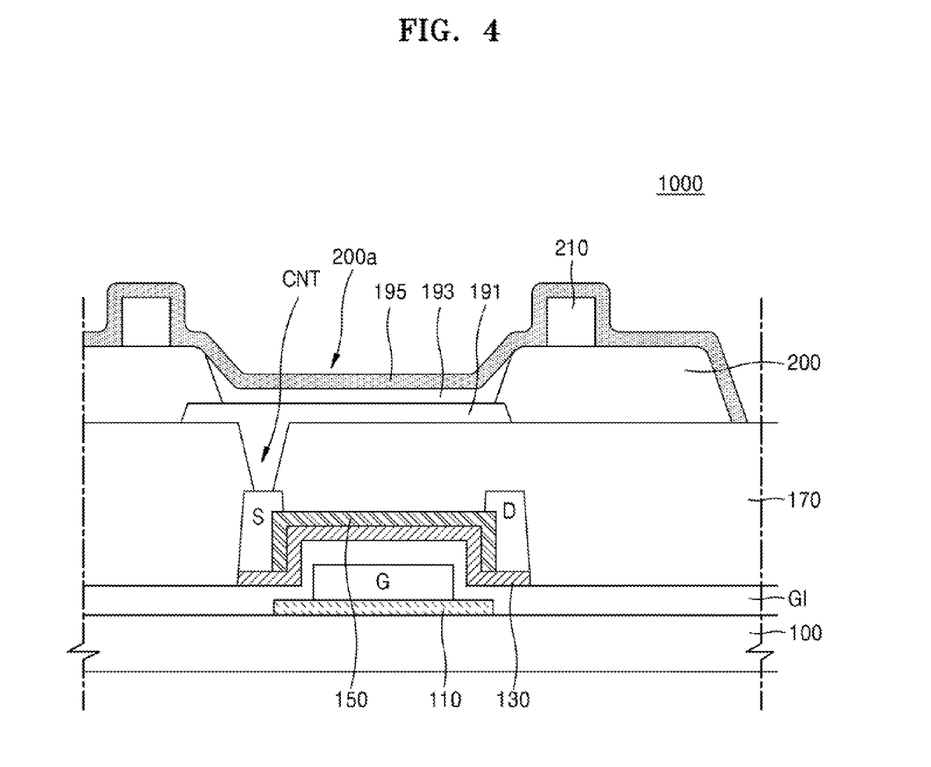
FIG. 4 is a cross-sectional view of the organic light-emitting display of FIG. 3 according to an exemplary embodiment of the inventive concept.

FIG. 3 is a plan view of an organic light-emitting display 1000 according to an exemplary embodiment of the inventive concept. FIG. 4 is a cross-sectional view of the organic light-emitting display 1000 of FIG. 3 according to an exemplary embodiment of the inventive concept. In FIGS. 3 and 4, elements previously described with reference to FIGS. 1 through 2D are denoted by the same reference numerals, and for convenience of description, a repeated explanation thereof may be omitted herein.

As shown in FIG. 3, the organic light-emitting display 1000 may be divided into a display area DA in which an image is displayed, and a non-display area around the display area DA in which an image is not displayed. The non-display area includes a sealing area SA and a pad area PA.

A sealing substrate and/or a sealing material may be disposed in the sealing area SA and may surround the display area DA. However, exemplary embodiments of the inventive concept are not limited thereto. For example, any configuration in which the sealing substrate and/or the sealing material seal the display area DA may be utilized according to exemplary embodiments.

The sealing substrate may be, for example, a thin-film encapsulation substrate. In this case, the sealing material may be omitted. The sealing substrate may prevent external moisture or air from penetrating into a plurality of TFTs and an OLED that are disposed on the substrate 100. A polarization film or a color filter may be further provided on the sealing substrate as desired.

The sealing material may be an inorganic material such as, for example, a frit. However, exemplary embodiments of the inventive concept are not limited thereto. For example, the sealing material may be epoxy. The sealing material may be coated using a dispenser or screen printing. The frit may refer to a raw material in a powder state used to form a glass, or may encompass a material in a paste state obtained by adding a laser or infrared absorber, an organic binder, or a filler for reducing a thermal expansion coefficient to a main material such as $SiO_2$. The frit in the paste state may be cured as the organic binder and moisture are removed during drying or firing. The laser or infrared absorber may include a transition metal compound. A laser beam may be used as a heat source for curing the sealing material and attaching the substrate 100 to the sealing substrate. A light-absorbing layer that assists in absorbing the laser beam during the curing using the laser beam may be further disposed under the sealing material. The light-absorbing layer may be formed of a conductive material having a high heat transfer coefficient.

The pad area PA refers to an area in which various members that drive pixels provided in the display area DA and other modules are mounted.

The OLED is provided on the substrate 100 in the display area DA. The OLED includes the pixel electrode 191, an intermediate layer 193 that includes an organic emission layer, and the counter electrode 195. The organic light-emitting display 1000 may further include a pixel-defining film 200 and spacers 210.

The pixel electrode 191 may be electrically connected to the source electrode S or the drain electrode D by filling the contact hole CNT of the via layer 170.

However, exemplary embodiments of the present inventive concept are not limited thereto. For example, in exemplary embodiments, a contact metal may be provided, the source electrode S or the drain electrode D may contact the contact metal, and the pixel electrode 191 may be electrically connected to the contact metal.

The pixel electrode 191 and/or the counter electrode 195 may be, for example, a transparent electrode or a reflective electrode. When the pixel electrode 191 and/or the counter electrode 195 is a transparent electrode, the pixel electrode 191 and/or the counter electrode may be formed of, for example, ITO, IZO, ZnO, or $In_2O_3$. When the pixel electrode 191 and/or the counter electrode 195 is a reflective electrode, the pixel electrode 191 and/or the counter electrode 195 may include, for example, a reflective film formed of Ag, Mg, Al, Pt, Pd, Au, Ni, Nd, Ir, Cr, or a compound thereof, and a transparent film formed of ITO, IZO, ZnO, or $In_2O_3$. In exemplary embodiments, the pixel electrode 191 and/or the counter electrode 195 may have an ITO/Ag/ITO structure.

The pixel-defining film 200 may define a pixel region and a non-pixel region. The pixel-defining film 200 may include an opening 200a through which the pixel electrode 191 is exposed, and may be formed to entirely cover the substrate

100. The intermediate layer 193 may be formed in the opening 200*a*, and the opening 200*a* may substantially occupy the pixel region.

The pixel electrode 191, the intermediate layer 193, and the counter electrode 195 constitute the OLED. Holes and electrons injected from the pixel electrode 191 and the counter electrode 195 of the OLED combine with each other in the organic emission layer of the intermediate layer 193 to generate light.

In an exemplary embodiment, the intermediate layer 193 may include only the organic emission layer. Alternatively, the intermediate layer 193 may include the organic emission layer and may further include at least one of a hole injection layer (HIL), a hole transport layer (HTL), an electron transport layer (ETL), and an electron injection layer (EIL). However, exemplary embodiments of the inventive concept are not limited thereto. For example, the intermediate layer 193 may include the organic emission layer and may further include other various functional layers.

The counter electrode 195 is formed on the intermediate layer 193. The counter electrode 195 may form an electric field with the pixel electrode 191 and may assist in the emission of light from the intermediate layer 193. The pixel electrode 191 may be patterned for each pixel, and the counter electrode 195 may be formed so that a common voltage is applied to all pixels. The counter electrode 195 may also be referred to as a common electrode 195.

Each of the pixel electrode 191 and the counter electrode 195 may be, for example, a transparent electrode or a reflective electrode. The pixel electrode 191 may function as an anode and the counter electrode 195 may function as a cathode. However, exemplary embodiments of the present inventive concept are not limited thereto. For example, the pixel electrode 191 may function as a cathode and the counter electrode 195 may function as an anode.

Although only one OLED is illustrated in FIG. 4, a display panel may include a plurality of the OLEDs. For example, one pixel may be formed for each of the OLEDs, and each pixel may emit red, green, blue, or white light.

However, exemplary embodiments of the present inventive concept are not limited thereto. For example, the intermediate layer 193 may be commonly formed over the pixel electrode 191 irrespective of a position of a pixel. In this case, the organic emission layer may be formed by vertically stacking or combining layers including light-emitting materials that emit, for example, red, green, and blue light. Other combinations that are capable of emitting white light may also be utilized. Further, according to exemplary embodiments, a color conversion layer or a color filter that converts the emitted white light into predetermined color light may be further provided.

A protective layer may be disposed on the counter electrode 195, and may cover and protect the OLED. The protective layer may be, for example, an inorganic insulating film and/or an organic insulating film.

The spacers 210 may be disposed between pixel regions in the display area DA. The spacers 210 may maintain a distance between the substrate 100 and the sealing substrate, and may prevent display characteristics from being deteriorated due to external impact.

The spacers 210 may be provided on the pixel-defining film 200. The spacers 210 may protrude from the pixel-defining film 200 toward the sealing substrate.

In exemplary embodiments, the spacers 210 may be formed of the same material by using the same process as those of the pixel-defining film 200. That is, the pixel-defining film 200 and the spacers 210 may be simultaneously formed at substantially the same time by adjusting the amount of light through an exposure process using a half-tone mask. However, exemplary embodiments of the present inventive concept are not limited thereto. For example, in exemplary embodiments, the pixel-defining film 200 and the spacers 210 may be sequentially or individually formed, and thus, may be independent structures formed using different materials.

As described above, in the organic light-emitting display 1000 according to an exemplary embodiment of the present inventive concept, since the gate-underlying stepped layer 110 is formed under the gate electrode G and a stepped portion of the gate electrode G is reduced, poor step coverage may be prevented/reduced. In addition, since the etch-stopper 150 extends to cover both ends of the gate-underlying stepped layer 110, a wiring load may be reduced and parasitic capacitance may be reduced/minimized. In addition, since the via layer 170 and the contact hole CNT are formed using one mask, the number of mask processes may be reduced, resulting in a reduction of the time and cost involved in manufacturing an organic light-emitting display.

According to exemplary embodiments of the inventive concept, since a gate-underlying stepped layer is formed, poor step coverage that occurs due to a stepped portion may be prevented.

Further, since an etch-stopper extends to have a width corresponding to a width of the gate-underlying stepped layer, a wiring load may be reduced.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A thin-film transistor (TFT) array substrate, comprising:
    a substrate;
    a gate-underlying stepped layer disposed on the substrate;
    a gate electrode disposed on the gate-underlying stepped layer, wherein the gate-underlying stepped layer has a width greater than a width of the gate electrode;
    a semiconductor layer formed over the gate electrode;
    an etch-stopper disposed on the semiconductor layer; and
    a source electrode and a drain electrode,
    wherein a portion of the source electrode and a portion of the drain electrode are disposed on the etch-stopper and overlap the gate-underlying stepped layer, and an entirety of the source electrode and an entirety of the drain electrode do not overlap the gate electrode.

2. The TFT array substrate of claim 1, wherein the etch-stopper has a width about equal to or greater than the width of the gate-underlying stepped layer.

3. The TFT array substrate of claim 1, wherein ends of the etch-stopper are substantially aligned with ends of the gate-underlying stepped layer, and the ends of the etch-stopper cover stepped portions of the gate electrode and the gate-underlying stepped layer.

4. The TFT array substrate of claim 1, further comprising:
    a via layer formed over the source electrode and the drain electrode and covering an entire upper surface of the substrate.

5. The TFT array substrate of claim 4, wherein the via layer comprises:
    a contact hole at least partially exposing one of the source electrode and the drain electrode, wherein the via layer and the contact hole are formed using one mask.

6. The TFT array substrate of claim 1, wherein a distance between the source electrode and the drain electrode is about equal to the width of the gate-underlying stepped layer.

7. The TFT array substrate of claim 6, further comprising:
a via layer formed over the source electrode and the drain electrode and covering an entire upper surface of the substrate.

8. The TFT array substrate of claim 7, wherein the via layer comprises:
a contact hole at least partially exposing one of the source electrode and the drain electrode,
wherein the via layer and the contact hole are formed using one mask.

9. The ITT array substrate of claim 1, further comprising:
a gate insulating film disposed between the gate electrode and the semiconductor layer.

10. A thin-film transistor (TFT) array substrate, comprising:
a substrate;
a gate-underlying stepped layer disposed on the substrate;
a gate electrode disposed on the gate-underlying stepped layer;
an oxide semiconductor layer formed over the gate electrode;
an etch-stopper disposed on the oxide semiconductor layer,
wherein the etch-stopper has a width about equal to a width of the gate-underlying stepped layer; and
a source electrode and a drain electrode,
wherein a portion of the source electrode and a portion of the drain electrode are disposed on the etch-stopper and overlap the gate-underlying stepped layer, and an entirety of the source electrode and an entirety of the drain electrode do not overlap the gate electrode.

11. The TFT array substrate of claim 10, wherein the gate-underlying stepped layer is disposed under the gate electrode, and the width of the gate underlying stepped layer is greater than a width of the gate electrode.

12. The TFT array substrate of claim 11, further comprising:
a via layer formed over the source electrode and the drain electrode and covering an entire upper surface of the substrate.

13. The TFT array substrate of claim 12, wherein the via layer comprises a contact hole at least partially exposing one of the source electrode and the drain electrode, and the via layer and the contact hole are formed using one mask.

14. The TFT array substrate of claim 10, wherein a distance between the source electrode and the drain electrode is about equal to the width of the gate-underlying stepped layer.

15. A thin-film transistor (TFT) array substrate, comprising:
a substrate;
a gate-underlying stepped layer disposed on the substrate;
a gate electrode disposed on the gate-underlying stepped layer;
an oxide semiconductor layer formed over the gate electrode;
a gate insulating film disposed between the gate electrode and the oxide semiconductor layer; and
an etch-stopper disposed on the oxide semiconductor layer,
wherein ends of the etch-stopper extend downward from the etch-stopper in a direction toward the gate-underlying stepped layer, the ends of the etch-stopper are substantially aligned with ends of the gate-underlying stepped layer, a portion of the oxide semiconductor layer and a portion of the gate insulating film are disposed between the ends of the etch-stopper, and the ends of the etch-stopper cover stepped portions of the gate-underlying stepped layer and the gate electrode.

16. An organic light-emitting display, comprising:
a substrate;
a display area comprising a plurality of pixels; and
a non-display area disposed around the display area,
wherein each of the plurality of pixels comprises:
a gate-underlying stepped layer disposed on the substrate;
a gate electrode disposed on the gate-underlying stepped layer, wherein the gate-underlying stepped layer has a width greater than a width of the gate electrode;
an oxide semiconductor layer formed over the gate electrode;
an etch-stopper disposed on the oxide semiconductor layer; and
a source electrode and a drain electrode,
wherein a portion of the source electrode and a portion of the drain electrode are disposed on the etch stopper and overlap the gate-underlying stepped layer, and an entirety of the source electrode and an entirety of the drain electrode do not overlap the gate electrode.

17. The organic light-emitting display of claim 16, wherein the etch-stopper has a width about equal to or greater than the width of the gate-underlying stepped layer.

18. The organic light-emitting display of claim 16, wherein ends of the etch-stopper are substantially aligned with ends of the gate-underlying stepped layer, and the ends of the etch-stopper cover stepped portions of the gate electrode and the gate-underlying stepped layer.

19. The organic light-emitting display of claim 16, further comprising:
a via layer formed over the source electrode and the drain electrode and covering an entire upper surface of the substrate.

20. The organic light-emitting display of claim 19, wherein the via layer comprises a contact hole at least partially exposing one of the source electrode and the drain electrode, and the via layer and the contact hole are formed using one mask.

21. The organic light-emitting display of claim 16, wherein a distance between the source electrode and the drain electrode is about equal to the width of the gate-underlying stepped layer.

22. The organic light-emitting display of claim 21, further comprising:
a via layer formed over the source electrode and the drain electrode and covering an entire upper surface of the substrate.

23. The organic light-emitting display of claim 22, wherein the via layer comprises a contact hole at least partially exposing one of the source electrode and the drain electrode, and the via layer and the contact hole are formed using one mask.

24. The organic light-emitting display of claim 16, further comprising:
a gate insulating film disposed between the gate electrode and the oxide semiconductor layer.

25. An organic light-emitting display, comprising:
a substrate;
a display area comprising a plurality of pixels; and a non-display area disposed around the display area,
wherein each of the plurality of pixels comprises:
a gate-underlying stepped layer disposed on the substrate;
a gate electrode disposed on the gate-underlying stepped layer;
an oxide semiconductor layer formed over the gate electrode;
an etch-stopper disposed on the oxide semiconductor layer,
wherein the etch-stopper has a width about equal to a width of the gate-underlying stepped layer; and
a source electrode and a drain electrode,
wherein a portion of the source electrode and a portion of the drain electrode are disposed on the etch-stopper and overlap the gate-underlying stepped layer, and an entirety of the source electrode and an entirety of the drain electrode do not overlap the gate electrode.

26. A method of forming a thin-film transistor (TFT) array substrate, comprising:
forming a substrate;
forming a gate-underlying stepped layer on the substrate;
forming a gate electrode on the gate-underlying stepped layer, wherein the gate-underlying stepped layer has a width greater than a width of the gate electrode;
forming a semiconductor layer over the gate electrode;
forming an etch-stopper on the semiconductor layer; and
forming a source electrode and a drain electrode over the etch-stopper,
wherein a portion of the source electrode and a portion of the drain electrode are disposed on the etch-stopper and overlap the gate-underlying stepped layer, and an entirety of the source electrode and an entirety of the drain electrode do not overlap the gate electrode.

27. The method of claim 26, further comprising:
forming a via layer over the source electrode and the drain electrode, wherein the via layer covers an entire upper surface of the substrate; and
forming a contact hole at least partially exposing one of the source electrode and the drain electrode, wherein the via layer and the contact hole are formed using one mask.

* * * * *